(12) United States Patent  
Choi et al.

(10) Patent No.: US 11,929,362 B2  
(45) Date of Patent: Mar. 12, 2024

(54) SEMICONDUCTOR INTEGRATED CIRCUIT DEVICE HAVING AN ELECTROSTATIC DISCHARGE PROTECTION CIRCUIT AND METHOD OF MANUFACTURING THE SEMICONDUCTOR INTEGRATED CIRCUIT DEVICE

(71) Applicant: SK hynix Inc., Icheon-si (KR)

(72) Inventors: Joung Cheul Choi, Daejeon (KR); Jae Young You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 80 days.

(21) Appl. No.: 17/534,182

(22) Filed: Nov. 23, 2021

(65) Prior Publication Data

US 2022/0085008 A1    Mar. 17, 2022

Related U.S. Application Data

(62) Division of application No. 16/230,598, filed on Dec. 21, 2018, now Pat. No. 11,201,145.

(30) Foreign Application Priority Data

Jun. 11, 2018  (KR) ........................ 10-2018-0066735

(51) Int. Cl.  
*H01L 27/02*    (2006.01)  
*H01L 29/08*    (2006.01)  
(Continued)

(52) U.S. Cl.  
CPC ...... *H01L 27/0259* (2013.01); *H01L 29/0821* (2013.01); *H01L 29/6625* (2013.01); *H01L 29/735* (2013.01)

(58) Field of Classification Search  
CPC ............ H01L 27/0259; H01L 21/8222; H01L 27/082; H01L 27/0248; H01L 23/60  
See application file for complete search history.

(56) References Cited

U.S. PATENT DOCUMENTS

| 4,954,865 A | 9/1990 | Rokos |
| 6,707,110 B2 | 3/2004 | Heyn et al. |
| (Continued) | | |

FOREIGN PATENT DOCUMENTS

| CN | 102412294 A | 4/2012 |
| CN | 102468299 A | 5/2012 |
| (Continued) | | |

*Primary Examiner* — Syed I Gheyas  
(74) *Attorney, Agent, or Firm* — William Park & Associates Ltd.

(57) ABSTRACT

A semiconductor integrated circuit device may include a semiconductor substrate, an active well, an emitter, a base, a collector, a body contact region, and a blocking well. The semiconductor substrate may have a first conductive type. The active well may be formed in the semiconductor substrate. The active well may have a second conductive type. The emitter and the base may be formed in the active well. The collector may be formed in the semiconductor substrate outside the active well. The body contact region may be formed in the semiconductor substrate to electrically connect the collector with the semiconductor substrate. The body contact region may have a conductive type substantially the same as that of the collector. The blocking well may be configured to surround an outer wall of the body contact region. The blocking well may have the second conductive type.

14 Claims, 4 Drawing Sheets

(51) Int. Cl.
*H01L 29/66* (2006.01)
*H01L 29/735* (2006.01)

(56) References Cited

U.S. PATENT DOCUMENTS

| | | |
|---|---|---|
| 6,861,711 B2 | 3/2005 | Mallikarjunaswamy |
| 6,864,537 B1 | 3/2005 | Mallikarjunaswamy |
| 6,888,710 B2 | 5/2005 | Mallikarjunaswamy et al. |
| 7,737,526 B2 | 6/2010 | Williams et al. |
| 7,745,882 B2 | 6/2010 | Kim |
| 7,795,681 B2 | 9/2010 | Williams et al. |
| 7,868,414 B2 | 1/2011 | Williams et al. |
| 8,030,731 B2 | 10/2011 | Williams et al. |
| 8,138,570 B2 | 3/2012 | Williams et al. |
| 8,258,575 B2 | 9/2012 | Williams et al. |
| 8,487,343 B2 | 7/2013 | Shirakawa et al. |
| 9,171,833 B2 | 10/2015 | Vinson |
| 9,299,693 B2 | 3/2016 | Ko et al. |
| 9,570,546 B2 | 2/2017 | Vanhoucke et al. |
| 9,583,603 B2 | 2/2017 | Zhan et al. |
| 9,633,993 B1 | 4/2017 | Appaswamy et al. |
| 9,768,768 B2 | 9/2017 | Pan et al. |
| 9,881,913 B2 | 1/2018 | Appaswamy et al. |
| 10,090,200 B2 | 10/2018 | Lian et al. |
| 2003/0006464 A1 | 1/2003 | Heyn et al. |
| 2004/0129983 A1 | 7/2004 | Mallikarjunaswamy |
| 2004/0137690 A1 | 7/2004 | Mallikarjunaswamy et al. |
| 2006/0131693 A1 | 6/2006 | Kim |
| 2008/0237656 A1 | 10/2008 | Williams et al. |
| 2008/0237704 A1 | 10/2008 | Williams et al. |
| 2008/0237706 A1 | 10/2008 | Williams et al. |
| 2008/0237782 A1 | 10/2008 | Williams et al. |
| 2008/0237783 A1 | 10/2008 | Williams et al. |
| 2009/0315072 A1 | 12/2009 | Shirakawa et al. |
| 2010/0009507 A1 | 1/2010 | Krutsick |
| 2010/0327315 A1 | 12/2010 | Shirakawa et al. |
| 2011/0012196 A1 | 1/2011 | Williams et al. |
| 2011/0291157 A1 | 12/2011 | Takahashi et al. |
| 2014/0151743 A1 | 6/2014 | Ko et al. |
| 2014/0225156 A1 | 8/2014 | Zhan et al. |
| 2014/0312384 A1 | 10/2014 | Wada et al. |
| 2015/0022921 A1 | 1/2015 | Vinson |
| 2016/0079345 A1 | 3/2016 | Vanhoucke et al. |
| 2016/0099240 A1* | 4/2016 | Chen ............... H01L 29/66681 438/236 |
| 2016/0173081 A1 | 6/2016 | Pan et al. |
| 2016/0268245 A1 | 9/2016 | Chen et al. |
| 2017/0186648 A1 | 6/2017 | Lian et al. |
| 2017/0287896 A1 | 10/2017 | Appaswamy et al. |
| 2018/0069111 A1 | 3/2018 | Noh et al. |
| 2019/0378833 A1 | 12/2019 | Choi et al. |

FOREIGN PATENT DOCUMENTS

| | | |
|---|---|---|
| CN | 103839941 A | 6/2014 |
| KR | 101131320 B1 | 4/2012 |

* cited by examiner

SEMICONDUCTOR INTEGRATED CIRCUIT DEVICE HAVING AN ELECTROSTATIC DISCHARGE PROTECTION CIRCUIT AND METHOD OF MANUFACTURING THE SEMICONDUCTOR INTEGRATED CIRCUIT DEVICE

CROSS-REFERENCES TO RELATED APPLICATION

The present application is a divisional application of U.S. patent application Ser. No. 16/230,598, filed on Dec. 21, 2018, and claims priority under 35 U.S.C. § 119(a) to Korean application number 10-2018-0066735, filed on Jun. 11, 2018, in the Korean Intellectual Property Office, which is incorporated herein by reference in its entirety.

BACKGROUND

1. Technical Field

Various embodiments may generally relate to a semiconductor integrated circuit device and a method of manufacturing the semiconductor integrated circuit device, more particularly, to a semiconductor integrated circuit device including an electrostatic discharge protection circuit, and a method of manufacturing the semiconductor integrated circuit device including the electrostatic discharge protection circuit.

2. Related Art

As semiconductor fabrication technologies develop, numbers of elements provided in one integrated circuit may be increased. Thus, the elements such as a memory, a processor, a voltage control circuit, etc., may be integrated in one integrated circuit. A system including one integrated circuit and the various elements integrated in the integrated circuit may be referred to as a system-on-chip (SOC). Because the SOC may include a single chip, the SOC may have a size smaller than that of a general system. Further, the SOC may have power consumption lower than that of the general system.

An electrostatic charge may be applied to the integrated circuit through input/output pads from an external device. The electrostatic charge may cause malfunctions of or damage to the integrated circuit. Therefore, an electrostatic discharge (ESD) protection circuit for protecting the integrated circuit from the electrostatic charge has been studied.

SUMMARY

In examples of embodiments of the present disclosure, a semiconductor integrated circuit device may include a semiconductor substrate, an active well, an emitter, a base, a collector, a body contact region, and a blocking well. The semiconductor substrate may have a first conductive type. The active well may be formed in the semiconductor substrate. The active well may have a second conductive type. The emitter and the base may be formed in the active well. The collector may be formed in the semiconductor substrate outside the active well. The body contact region may be formed in the semiconductor substrate to electrically connect the collector with the semiconductor substrate. The body contact region may have a conductive type substantially the same as that of the collector. The blocking well may be configured to surround an outer wall of the body contact region. The blocking well may have the second conductive type.

In examples of embodiments of the present disclosure, a semiconductor integrated circuit device may include a P type semiconductor substrate, an N well, a collector, isolation layers, a body contact region, and an N type blocking well. The semiconductor substrate may include a P type epitaxial layer. The N well may be formed in the epitaxial layer. The N well may include a base having N type impurities and an emitter having P type impurities. The collector may be formed in the epitaxial layer. The collector may be spaced apart from the N well. The collector may have P type impurities. The isolation layers may isolate the base, the emitter, and the collector from each other. The body contact region may be arranged under the collector. The blocking well may make contact with low surfaces of the isolation layers. The blocking well may be configured to surround an outer wall of the body contact region. An electrostatic charge may not flow into a region where the blocking well is formed.

In examples of embodiments of the present disclosure, according to a method of manufacturing a semiconductor integrated circuit device, a first conductive type body contact region may be formed in a first conductive type semiconductor substrate. Isolation layers may be formed in the semiconductor substrate. A second conductive type active well may be formed in the semiconductor substrate. The active well may be spaced apart from the body contact region. A second conductive type blocking well may be formed at a side of the body contact region. A base and an emitter may be formed in the active well between the isolation layers. A collector may be formed in the body contact region.

DETAILED DESCRIPTION

Various embodiments of the present disclosure will be described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the concepts described herein. Although a few embodiments of the present disclosure will be shown and described, it will be appreciated by those of ordinary skill in the art that changes may be made in these embodiments without departing from the principles and spirit of the present disclosure.

Figure 1:
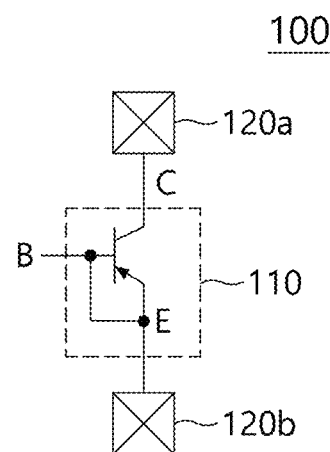
FIG. 1 is a circuit diagram illustrating an electrostatic discharge protection circuit in accordance with examples of embodiments.

FIG. 1 is a circuit diagram illustrating an electrostatic discharge protection circuit in accordance with examples of embodiments.

Referring to FIG. 1, an electrostatic discharge (ESD) protection circuit 100 may include a PNP transistor 110. The PNP transistor 110 may include a base B, a collector C, and an emitter E. The collector C and the emitter E may be connected with first and second pads 120a and 120b, respectively. The base B may be coupled to the emitter E. In some cases, a resistor (not illustrated) may be connected between the base B and the emitter E.

For example, when a negative electrostatic charge is inputted into the first pad 120a, a reverse bias may be generated between the collector C and the base B of the PNP transistor 110. Further, an equipotential or a forward bias may be generated between the emitter E and the base B. Thus, the negative electrostatic charge inputted through the collector C may be discharged through the second pad 120b connected to the emitter E.

In contrast, when a positive electrostatic charge is inputted into the second pad 120b, an equipotential or a forward bias may be generated between the emitter E and the base B of the PNP transistor 110. Further, a reverse bias may be generated between the collector C and the base B. Thus, the positive electrostatic charge inputted through the emitter E may be discharged through the first pad 120a connected to the collector C.

Figure 2:
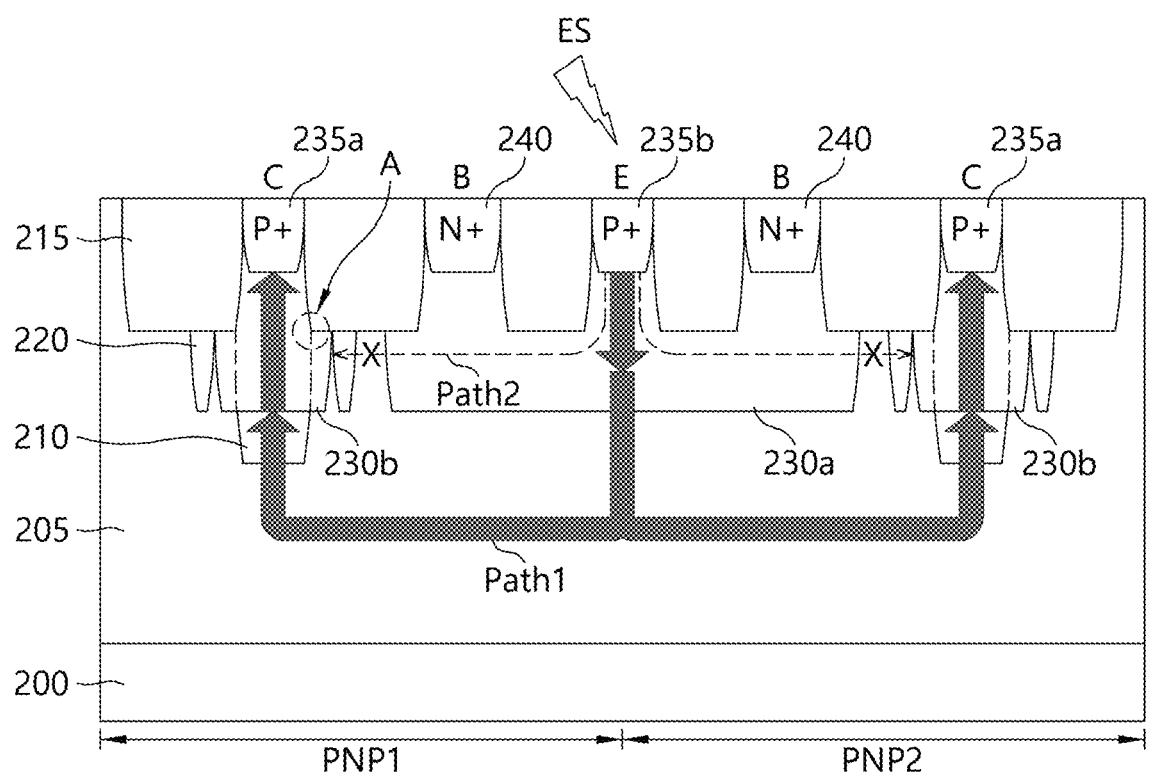
FIG. 2 is a cross-sectional view illustrating an electrostatic discharge protection circuit integrated on a semiconductor substrate in accordance with examples of embodiments.

FIG. 2 is a cross-sectional view illustrating an electrostatic discharge protection circuit integrated on a semiconductor substrate in accordance with examples of embodiments.

Referring to FIG. 2, a first conductive type semiconductor substrate 200 may be prepared (e.g., a semiconductor substrate 200 with a first conductive type). The first conductive type may include P type impurities. The semiconductor substrate 200 may include the first conductive type epitaxial layer 205 (e.g., an epitaxial layer 205 with a first conductive type).

PNP transistors PNP1 and PNP2 may be integrated on the semiconductor substrate 200. The PNP transistors PNP1 and PNP2 may function as an ESD protection element.

Each of the PNP transistors PNP1 and PNP2 may include a base B, an emitter E, and a collector C. The PNP transistors PNP1 and PNP2 may include a substrate type-PNP transistor which is formed in the substrate 200. The base B and the emitter E may be formed in an active well 230a of the substrate 200. The collector C may make contact with the semiconductor substrate 200. In other words, the collector C is not formed in the active well 230a.

The active well 230a may include second conductive type impurities, for example, N type impurities (e.g., active well 230a with a second conductive type). The base B may include the second type impurity region, i.e., the N type impurity region 240. The emitter E may include the first type impurity region, i.e., the P type impurity region 235b. The collector C may include the first type impurity region, i.e., the P type impurity region 235a. The emitter E and the collector C may include a doping concentration higher than that of the semiconductor substrate 200. The base B may include a doping concentration higher than that of the active well 230a. For example, the emitter E is shared between the PNP transistors PNP1 and PNP2.

Isolation layers 215 may be formed between the impurity region 240 corresponding to the base B, the impurity region 235a corresponding to the collector C, and the impurity region 235b corresponding to the emitter E to electrically isolate the base B, the collector C, and the emitter E from each other. The isolation layers 215 may have a depth greater than that of the impurity regions 235a, 235b, and 240, and less than that of the active well 230a.

A body contact region 210 may be formed under the collector C. The body contact region 210 may function as to contact the collector C with the epitaxial layer 205. The body contact region 210 may have a deep junction structure for electrically connecting the collector C with the epitaxial layer 205. For example, the body contact region 210 may have a depth greater than that of the isolation layers 215.

A blocking well 230b may be formed at a side of the body contact region 210. In an embodiment, the blocking well 230b may also be formed between and/or under the isolation layers 215 which isolate the collector C. In an embodiment, the blocking well 230b may be formed to make contact with low surfaces of the isolation layers 215, which isolate the collector C, and to surround a sidewall of the body contact region 210. For example, the blocking well 230b may include the second type impurities, for example, the N type impurities (e.g., blocking well 230b with a second conductive type). The blocking well 230b may function as to detour a transmission path of the electrostatic charge.

For example, when the positive electrostatic charge ES flows through the emitter E, the positive electrostatic charge ES may be discharged through the shortest path from the emitter E to the collector C.

When the blocking well 230b is not provided, the shortest path (Path2) may be generated along portions under the isolation layers 215. During the discharge of the positive electrostatic charge ES through the portions under the isolation layers 215, the positive electrostatic charge ES may damage a lower corner 'A' of the isolation layers 215 so that the isolation layers 215 may be destroyed.

In contrast, according to examples of embodiments, when the blocking well 230b is formed on a sidewall of the body contact region 210, a parasitic bipolar path might not be generated between the P type epitaxial layer 205 and the blocking well 230b. Thus, the positive electrostatic charge ES might not directly flow into the second conductive type blocking well 230b. The positive electrostatic charge ES may detour toward the body contact region 210 having the P type impurity region. The detoured positive electrostatic charge ES may then be discharged through the collector C. That is, the blocking well 230b may function as to form a detour path (Path1). The detour path (Path1) may prevent damages to the isolation layers 215. A reference numeral 220 may be a protection well for protecting the blocking well 230b. For example, the protection well 220 may be formed at a side of the blocking well 230b. The protection well 220 may include a retrograde well having a P type impurity region.

FIGS. 3 to 8 are cross-sectional views illustrating a method of manufacturing an electrostatic discharge protection circuit in accordance with examples of embodiments.

Figure 3:
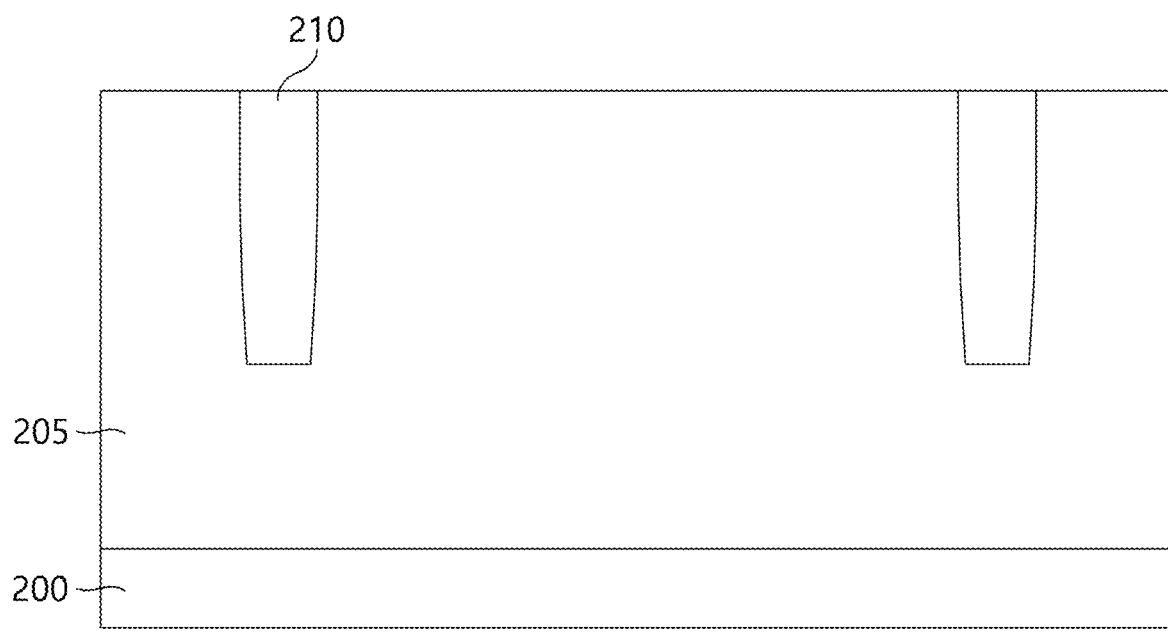
FIGS. 3 to 8 are cross-sectional views illustrating a method of manufacturing an electrostatic discharge protection circuit in accordance with examples of embodiments.

Referring to FIG. 3, a semiconductor substrate 200 may be prepared. The semiconductor substrate 200 may include a silicon substrate including first type impurities, for example, P type impurities. Alternatively, the semiconductor substrate 200 may include other various semiconductor substrates as well as the silicon substrate.

The semiconductor substrate 200 may be epitaxially grown to form a P type epitaxial layer 205. A mask pattern (not illustrated) may be formed on the semiconductor substrate 200 to expose a region of the epitaxial layer 205 where a collector may be formed. P type impurities may be implanted into the exposed epitaxial layer 205 to form a body contact region 210 (e.g., a body contact region 210 with a first conductive type). The mask pattern (not illustrated) may then be removed. The body contact region 210 may include a heavily doped P type impurity region having a level substantially similar to that of the region where the collector may be formed. For example, the body contact region 210 may include the heavily doped P type impurity region (e.g., P type impurity region having a high concentration of P type impurities) to electrically connect a collector C with the epitaxial layer 205.

Figure 4:
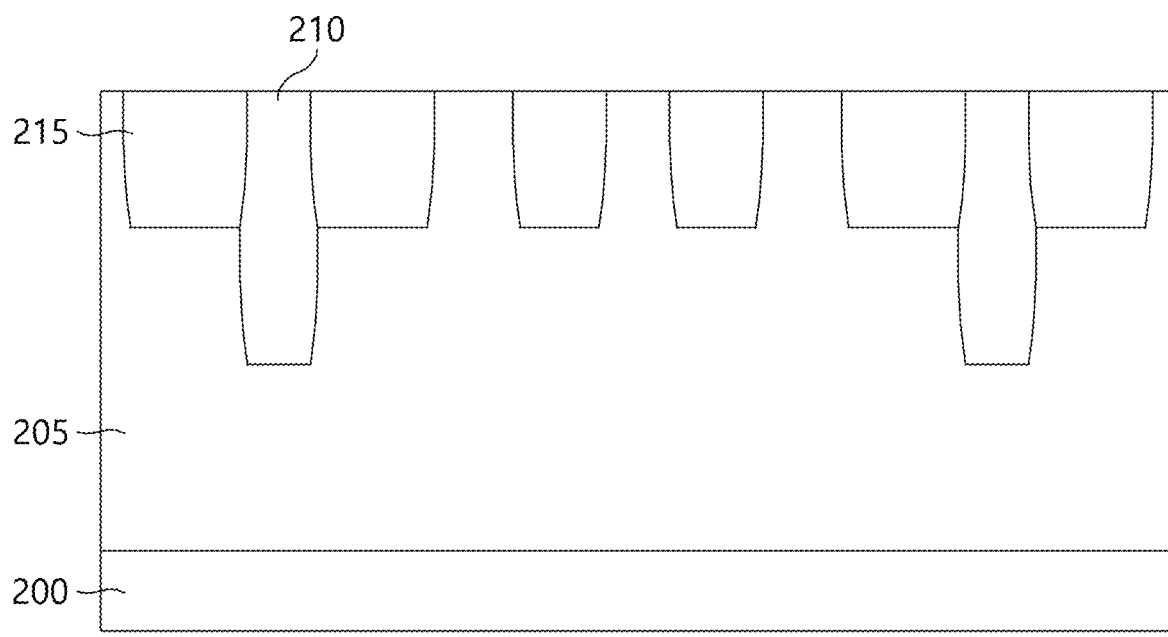

Referring to FIG. 4, isolation layers 215 may be formed in the epitaxial layer 205. The isolation layers 215 may be formed by a shallow trench isolation (STI) process. The isolation layers 215 may be formed between regions where a base, the collector, and the emitter may be formed. The isolation layers 215 may have a depth less than that of the body contact region 210.

Figure 5:
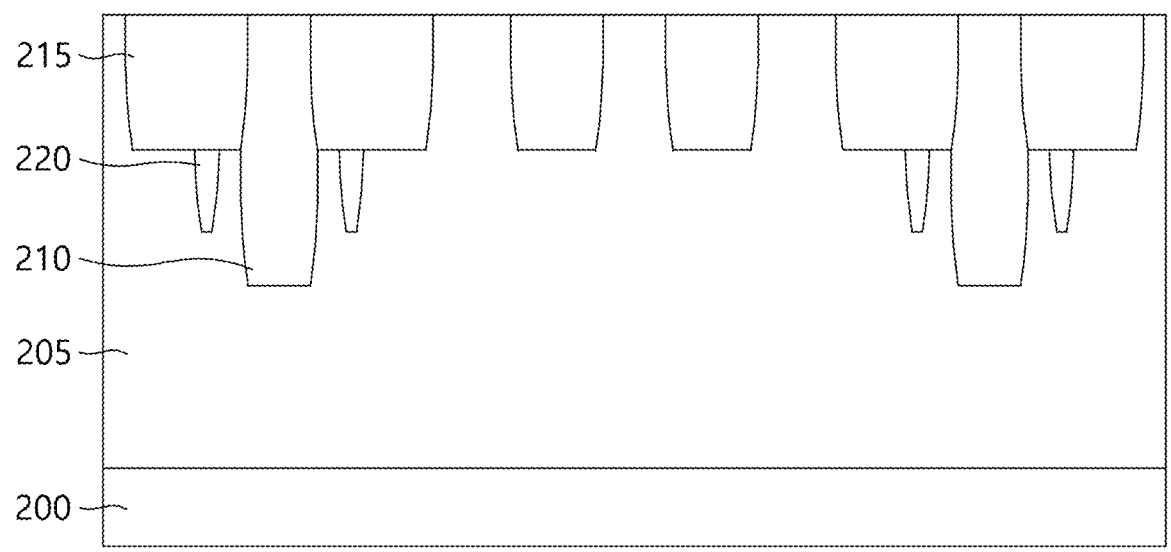

Referring to FIG. 5, a mask pattern (not illustrated) may be formed on the semiconductor substrate 200 to partially expose a portion outside the body contact region 210. For example, the mask pattern (not illustrated) may be configured to expose the isolation layers 215 surrounding the body contact region 210. First conductive type impurities, for example, P type impurities may be implanted into the exposed region through the mask pattern (not illustrated) to form a protection well 220 (e.g., a protection well 220 with a first conductive type). A target depth of the ion implantation may be positioned under the isolation layers 215. Thus, the protection well 220 may be positioned under the isolation layers 215. Further, the protection well 220 may be spaced apart from a sidewall of the body contact region 210. The protection well 220 may have a depth less than that of the body contact region 210. The mask pattern (not illustrated) may then be removed. Alternatively, the process for forming the protection well 220 may be omitted.

Figure 6:
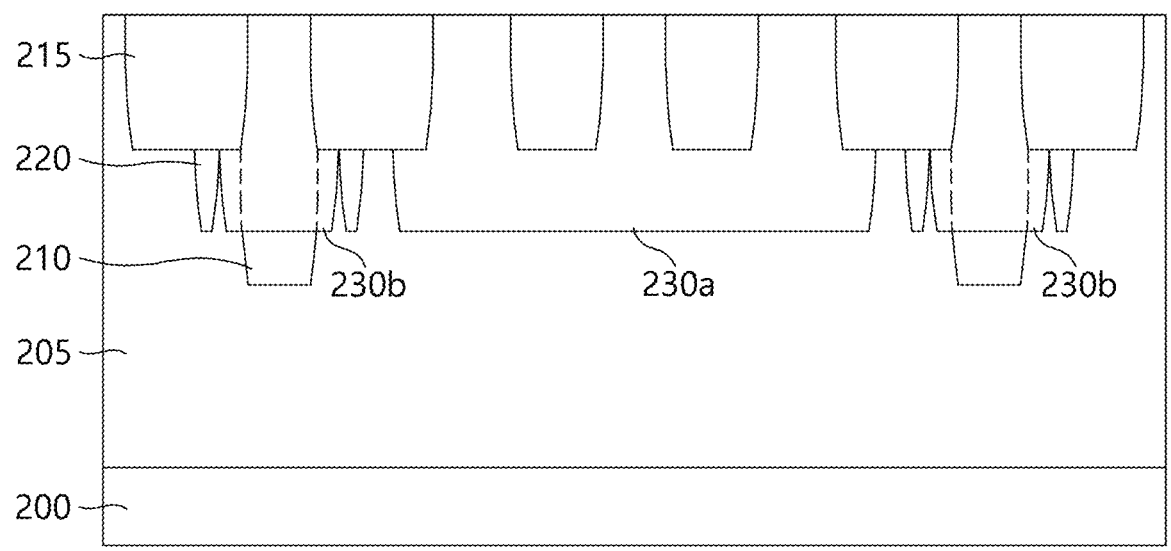

Referring to FIG. 6, a mask pattern (not illustrated) may be formed on the semiconductor substrate 200 to expose the regions where the base, the collector, and the emitter may be formed. The mask pattern (not illustrated) may have a first window and a second window. The first window may be configured to expose the regions where the base and the emitter may be formed. The second window may be configured to expose the region where the collector may be formed. The first window may have a size larger than that of the regions where the base and the emitter may be formed. The second window may have a size larger than that of the region where the collector may be formed. In order to prevent the protection well 220 from being exposed through the second window, the size of the second window may be controlled.

Second conductive type impurities, for example, N type impurities may be implanted into the regions exposed through the mask pattern (not illustrated) to form an active well 230a in the first window and a blocking well 230b in the second window. In an embodiment, forming the active well 230a in the first window and the blocking well 230b in the second window may include implanting the second conductive type impurities (e.g., N type impurities) into the semiconductor substrate 200 and into the isolation layers 215 at a periphery of the body contact region 210, respectively. The active well 230a and the blocking well 230b may include an N well. Further, the active well 230a and the blocking well 230b may have a depth substantially the same as that of the protection well 220.

Because the N type impurities for forming the blocking well 230b may have a low concentration, the N type impurities for the blocking well 230b in the body contact region 210 may be negligible when the N type impurities for forming the blocking well 230b is implanted into the body contact region 210 having the heavily doped P type impurities. For example, the concentration of N type impurities may be lower than the concentration of P type impurities in the formed body contact region 210. Thus, the blocking well 230b may be interposed between the body contact region 210 and the protection well 220 to surround the body contact region 210. The mask pattern may then be removed.

Figure 7:
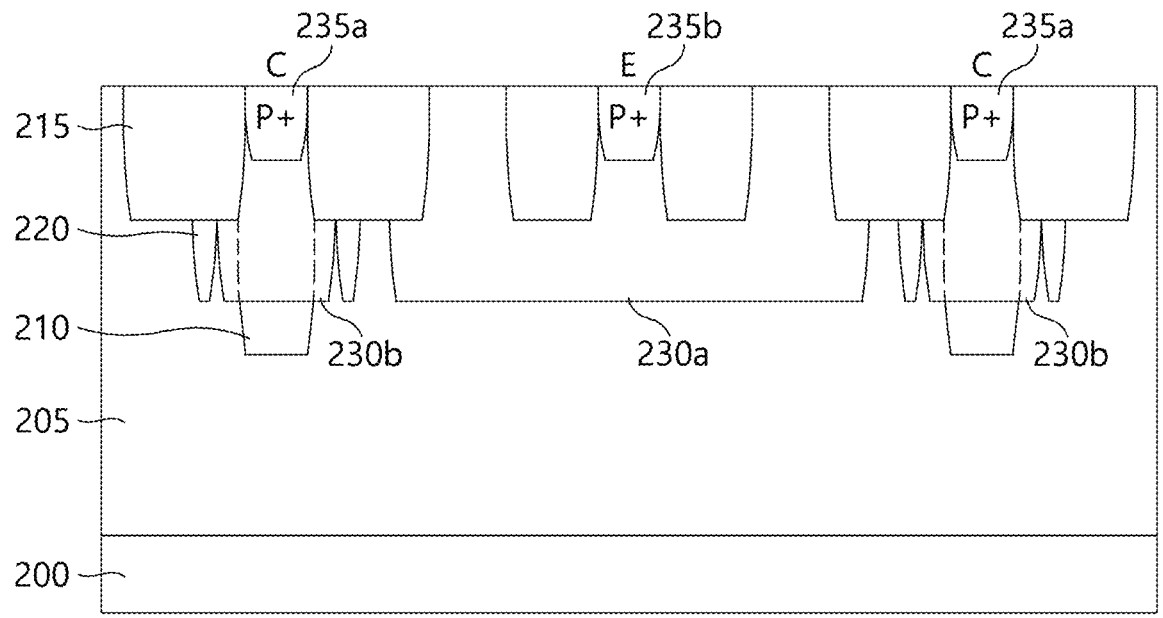

Referring to FIG. 7, a mask pattern (not illustrated) may be formed on the semiconductor substrate 200 to expose the regions where the collector C and the emitter E may be formed. P type impurities having a high concentration (i.e., a high concentration of P type impurities) may be implanted into the regions exposed through the mask pattern (not illustrated) to form the collector C including a P type impurity region 235a having a high concentration and the emitter E including a P type impurity region 235b having a high concentration. The collector C may be formed in the body contact region 210 making contact with the epitaxial layer 205. The emitter E may be formed in the active well 230a. The mask pattern (not illustrated) may be removed.

Figure 8:
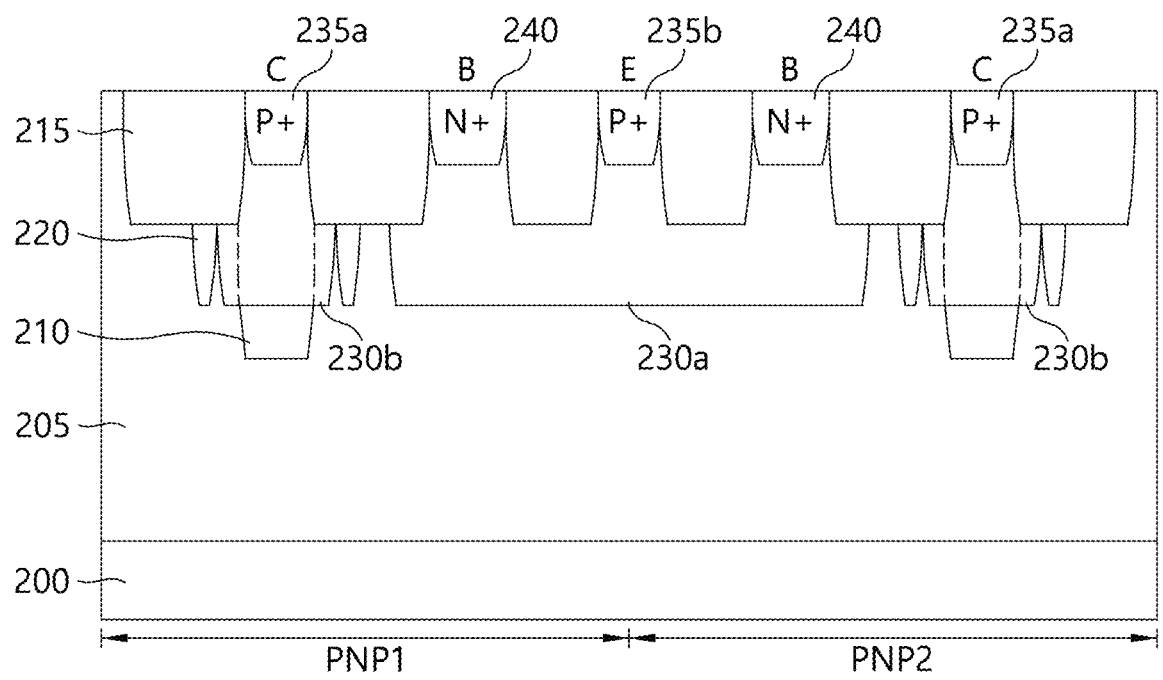

Referring to FIG. 8, a mask pattern (not illustrated) may be formed on the semiconductor substrate 200 to expose the region where the base may be formed. N type impurities having a high concentration may be implanted into the region exposed through the mask pattern (not illustrated) to form the base B including an N type impurity region 240 having a high concentration, thereby completing the ESD protection circuit including PNP transistors PNP1 and PNP2.

According to examples of embodiments, the blocking well 230b may be formed outside the body contact region 210 under the collector C. The conductive type of the blocking well 230b may be opposite to the conductive type of the epitaxial layer 205 and the body contact region 210. The blocking well 230b may block the shortest discharge path (Path2) of the electrostatic charge under the isolation layers 215. Thus, the actual discharge path (Path1) of the electrostatic charge may be formed between the emitter E, the active well 230a, the epitaxial layer 205, the body contact region 210, and the collector C due to the blocking well 230b. As a result, because the discharge path of the electrostatic charge might not be generated under the isolation layers when discharging the electrostatic charge, the isolation layers may be protected. Further, because the discharge path of the electrostatic charge may be detoured and lengthened by the blocking well, the electrostatic charge may be effectively discharged.

In examples of embodiments, the electrostatic charge may flow through the emitter. Alternatively, the electrostatic charge flowing through the collector may be detoured by the blocking well to protect the isolation layers from the electrostatic charge.

The above described embodiments are intended to illustrate and not to limit the present disclosure. Various alternatives and equivalents are possible. The present disclosure is not limited by the embodiments described herein. Nor is the present disclosure limited to any specific type of semiconductor device. Possible additions, subtractions, or modifications may be obvious in view of the present disclosure and are intended to fall within the scope of the appended claims.

What is claimed is:

1. A method of manufacturing a semiconductor integrated circuit device, the method comprising:
   providing a semiconductor substrate having a first conductivity type;
   forming a body contact region in the semiconductor substrate, the body contact region including first impurities having the first conductivity type;
   forming isolation layers in the semiconductor substrate;
   implanting second impurities with a second conductivity type opposite to the first conductivity type to the semiconductor substrate, thereby forming a first well which is spaced from the body contact region and a second well which contacts with a sidewall of the body contact region; and
   forming a base and an emitter in the first well between the isolation layers and forming a collector in the body contact region,
   wherein the first well and the second well are formed to have a same depth.

2. The method of claim 1, wherein providing the semiconductor substrate comprises forming an epitaxial layer in the semiconductor substrate.

3. The method of claim 1, wherein the first well and second well are formed to have a depth greater than a depth of the isolation layers.

4. The method of claim 1,
   wherein the second impurities include a concentration lower than a concentration of the first impurities.

5. The method of claim 1, wherein forming the base, the emitter, and the collector comprises:
   implanting first conductivity type impurities into the body contact region to form the collector and into a first portion of the first well to form the emitter; and
   implanting second conductivity type impurities into a second portion of the first well to form the base.

6. The method of claim 1,
   wherein the collector and emitter include impurities with the first conductivity type, and the base includes impurities with the second conductivity type.

7. The method of claim 1, further comprising:
   forming a third well having a first conductivity type to surround a sidewall of the second well.

8. The method of claim 1, wherein the second well is formed in the body contact region to have a width wider than a width of the body contact region.

9. The method of claim 1, wherein a depth of the second well is shallower than a depth of the body contact region.

10. A method of manufacturing a semiconductor integrated circuit device, the method comprising:
    forming body contact region with a first depth in a semiconductor substrate by implanting first impurities;
    forming isolation layers with a second depth for defining active regions in the semiconductor substrate, the second depth being shallower than the first depth;
    forming a first and second wells in the semiconductor substrate by implanting second impurities with a conductivity type opposite to a conductivity of the first impurities, the first well formed to include the active regions and some of the isolation layers, the second well formed to contact a sidewall of the body contact region, and the second well including a third depth shallower than the first depth; and
    forming junction electrodes in the semiconductor substrate,
    wherein the first well includes the third depth, and the third depth is greater than the second depth being shallower than the first depth.

11. The method of claim 10, further comprising:
    growing an epitaxial layer in the semiconductor substrate,
    wherein at least one of the body contact region, the isolation layers, the first well, the second well and the junction electrodes are formed in the epitaxial layer.

12. The method of claim 10, further comprising:
    forming a retrograde well to surround a sidewall of the second well,
    wherein the retrograde well is formed to include the third depth, and
    a conductivity of the retrograde well is same with a conductivity type of the body contact region.

13. The method of claim 10, wherein forming junction electrodes includes:
    forming an emitter in a selected one of the active regions and a collector in the body contact region, and
    forming a base in another selected one of the active regions,
    wherein base is formed between the emitter and the collector,
    a conductivity of the emitter and collector is same with a conductivity of the body contact region, and
    a conductivity of the base is same with a conductivity of the first and second wells.

14. The method of claim 10,
    wherein the first impurities include a P conductivity type and the second impurities include an N conductivity type.

* * * * *